(12) United States Patent
Biryukov et al.

(10) Patent No.: US 8,004,147 B2
(45) Date of Patent: Aug. 23, 2011

(54) WAVEGUIDE COMPONENTS ON THE BASIS OF ACOUSTIC SURFACE WAVES, AND THEIR USE

(75) Inventors: Sergey Biryukov, Bannewitz (DE); Guenter Martin, Dresden (DE); Manfred Weihnacht, Malter (DE)

(73) Assignee: Leibniz-Institut fuer Festkoerper- und Werkstofforschung Dresden e.V., Dresden (DE)

( * ) Notice: Subject to any disclaimer, the term of this patent is extended or adjusted under 35 U.S.C. 154(b) by 207 days.

(21) Appl. No.: 12/310,472

(22) PCT Filed: Sep. 2, 2007

(86) PCT No.: PCT/EP2007/059154
§ 371 (c)(1),
(2), (4) Date: Feb. 25, 2009

(87) PCT Pub. No.: WO2008/028879
PCT Pub. Date: Mar. 13, 2008

(65) Prior Publication Data
US 2010/0007241 A1 Jan. 14, 2010

(30) Foreign Application Priority Data
Sep. 4, 2006 (DE) .......................... 10 2006 042 616

(51) Int. Cl.
*H03H 9/25* (2006.01)
(52) U.S. Cl. ................. 310/313 B; 310/313 R
(58) Field of Classification Search .............. 310/313 R, 310/313 B
See application file for complete search history.

(56) References Cited

U.S. PATENT DOCUMENTS

| 3,815,056 | A | | 6/1974 | Meyer et al. |
| 3,914,717 | A | * | 10/1975 | Rosenberg et al. ........... 333/154 |
| 4,384,409 | A | * | 5/1983 | Lao ............................... 33/318 |
| 4,453,242 | A | * | 6/1984 | Toda ............................ 369/132 |
| 4,477,892 | A | * | 10/1984 | Tosima et al. ................ 369/132 |
| 5,307,035 | A | * | 4/1994 | Dufilie et al. ................. 333/193 |
| 7,878,063 | B1 | * | 2/2011 | Cular et al. .................... 73/579 |
| 2004/0052456 | A1 | * | 3/2004 | Boffi et al. ...................... 385/31 |
| 2007/0084284 | A1 | * | 4/2007 | Nakaso et al. .................. 73/584 |

(Continued)

FOREIGN PATENT DOCUMENTS
DE 2 018 590 10/1971
(Continued)

OTHER PUBLICATIONS

International Search Report Nov. 27, 2007.
(Continued)

*Primary Examiner* — Thomas M Dougherty
(74) *Attorney, Agent, or Firm* — Collard & Roe, P.C.

(57) ABSTRACT

The invention relates to waveguide components based on acoustic surface waves, comprising at least one interdigital converter for exciting acoustic surface waves in a piezoelectric substrate or a piezoelectric layer. The object of the invention is to change known waveguide components, comprising at least one interdigital converter for exciting acoustic surface waves in a piezoelectric substrate or a piezoelectric layer, such that no reflectors are necessary with an otherwise equivalent function. The inventive waveguide components are characterized in that the interdigital converter(s) a) is or are disposed at a defined distance over the piezoelectric substrate or the piezoelectric layer for exciting wave fields, or b) is or are in contact with the piezoelectric substrate or the piezoelectric layer, wherein in version a) the piezoelectric substrate is designed as a ring and the piezoelectric layer is designed as a circular region. In case of version b), the interdigital converter and/or the piezoelectric layer form circular regions. The components can be used for example as resonators, filters, oscillators and sensors.

19 Claims, 4 Drawing Sheets

U.S. PATENT DOCUMENTS

Figure 1:
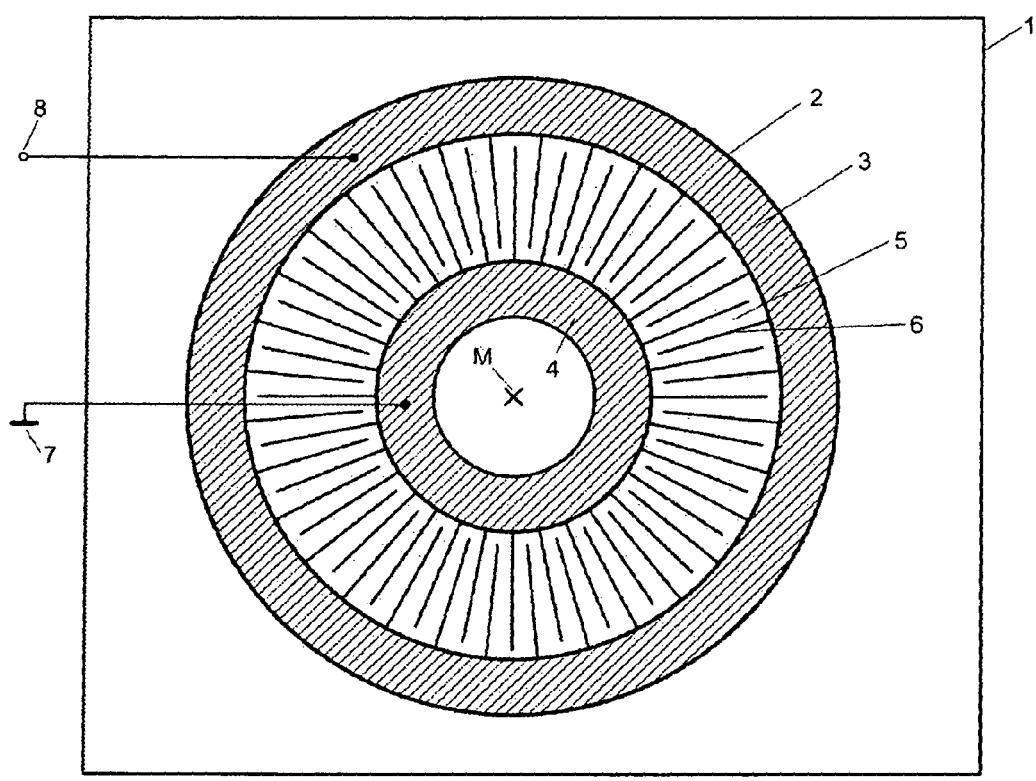

2007/0241639 A1 * 10/2007 Nakaso et al. ............ 310/313 R

FOREIGN PATENT DOCUMENTS

| EP | 0 577 089 | | 1/1994 |
|---|---|---|---|
| EP | 1 453 199 | | 9/2004 |
| GB | 2 126 818 | | 3/1984 |
| JP | 03-118784 | * | 5/1981 |

OTHER PUBLICATIONS

F. Sandy and T.E. Parker: "Surface Acoustic Wave Ring Filter" Proc. 1976 IEEE Ultrasonics Sumposium p. 391-396. (Spec, p. 2).

V.P. Plessky, S.N. Kondratiev, R. Stierlein, and F. Nyffeler: "SAW Tags: New Ideas," Proc. 1995 IEEE Ultrasonics Symposium, p. 117-120. (Spec, p. 2).

* cited by examiner

WAVEGUIDE COMPONENTS ON THE BASIS OF ACOUSTIC SURFACE WAVES, AND THEIR USE

CROSS REFERENCE TO RELATED APPLICATIONS

This application is the National Stage of PCT/EP2007/059154 filed on Sep. 2, 2007, which claims priority under 35 U.S.C. §119 of German Application No. 10 2006 042 616.9 filed on Sep. 4, 2006. The international application under PCT article 21(2) was not published in English.

TECHNICAL FIELD

The invention relates to waveguide components on the basis of acoustic surface waves, containing at least one interdigital converter for exciting acoustic surface waves in a piezoelectric substrate or a piezoelectric layer. The components can be used, for example, as resonators, filters, oscillators, and sensors.

STATE OF THE ART

Waveguide components of various types are already known. In a special embodiment, the substrate is piezoelectric, and a structured metal layer is applied to its surface. The metal layer is structured in such a manner that two interdigital converters disposed next to one another in the direction of the tines and four reflectors having inclined reflection strips are formed. The converters and the reflectors are disposed in two tracks, whereby one converter and two reflectors, in each instance, form a track. The reflector strips are inclined, relative to the converter tines, in such a manner that the surface waves that proceed from the converters and are reflected by the reflectors of the other track, in each instance, are deflected by 90° by means of reflection. As a result of the four reflectors, a total deflection of 360° comes about in this way, and the entire wave field within the structure is ring-shaped (F. Sandy and T. E. Parker: "Surface Acoustic Wave Ring Filter," Proc. 1976 IEEE Ultrasonics Symposium, p. 391-396, and also V. P. Plessky, S. N. Kondratiev, R. Stierlein, and F. Nyffeler: "SAW Tags: New Ideas," Proc. 1995 IEEE Ultrasonics Symposium, p. 117-120).

Such waveguide components have the disadvantage that they work at a relatively great total loss, which is essentially due to the reflectors that are present.

DISCLOSURE OF THE INVENTION

The invention is based on the task of modifying waveguide components of the known type, containing at least one interdigital converter for exciting acoustic surface waves in a piezoelectric substrate or a piezoelectric layer, in such a manner that no reflectors are required, while the function remains the same.

This task is accomplished with the characteristics contained in the claims.

The waveguide components according to the invention are characterized in that the interdigital converter or converters
a) are disposed at a defined distance above the piezoelectric substrate or the piezoelectric layer for exciting wave fields, or
b) are in contact with the piezoelectric substrate or the piezoelectric layer,
whereby in the case of Variant a), the piezoelectric substrate is configured as a ring, and the piezoelectric layer is configured as a ring-shaped region, and in the case of Variant b), the interdigital converters and/or the piezoelectric layer form ring-shaped regions.

In the case of Variant a), the interdigital converters are disposed above the piezoelectric substrate or the piezoelectric layer at a distance that is smaller than the period length of the interdigital converters.

In the case of Variant a), the piezoelectric ring is delimited, according to the invention, with curved and/or straight edges.

In the case of Variant a), the ring-shaped region of the piezoelectric layer, and in the case of Variant b), the ring-shaped region of the interdigital converters and/or of the piezoelectric layer is delimited with curved and/or straight lines.

In the case of Variant a), the interdigital converters can be disposed so as to be displaceable relative to the piezoelectric substrate or the piezoelectric layer.

In the case of Variant a), it is advantageous if the interdigital converters are disposed on an isotropic material.

In the case of Variant a), a non-piezoelectric substrate can be used, which has one or more ring-shaped piezoelectric regions, which are delimited by curved and/or straight lines.

In the case of Variant b), the interdigital converters, while avoiding reflector assemblies, form ring-shaped regions that are delimited by curved and/or straight lines.

In the case of Variant b), if multiple interdigital converters are present, these are disposed one after the other in the wave propagation direction. In this connection, they form ring-shaped regions that are delimited by curved and/or straight lines.

In the waveguide component according to the invention, one or more single-phase or multi-phase unidirectional converters can be present as interdigital converters.

According to the invention, an alternating field composed of multiple components can be applied to the interdigital converters; the phases of this field are shifted, relative to one another.

In the case of Variant b) with a ring-shaped interdigital converter, the piezoelectric substrate can be a slice of a crystal having hexagonal symmetry, whereby the normal line of the substrate surface and the hexagonal axis are parallel to one another.

In the case of Variant b), the interdigital converters can advantageously be configured in ring shape, in the form of a circle, an ellipsis, or a polygon.

According to the invention, the layer thickness of the interdigital converters and/or the material of the piezoelectric substrate and of the piezoelectric layer are selected in such a manner that the phase velocity of the acoustic surface waves within the ring-shaped region of the piezoelectric layer and within the ring-shaped region of the interdigital converter is less than outside of these regions.

According to a practical embodiment of the invention, the metal layer thickness of the fingers of the interdigital converters is greater or less than the layer thickness of the metal layer that connects the fingers.

The piezoelectric layer can be disposed on an isotropic material.

If multiple interdigital converters are present in different ring-shaped regions, these should be disposed so closely adjacent that their wave fields are partially superimposed. This can be implemented in that one other ring-shaped interdigital converter is surrounded by at least one of the interdigital converters configured in ring-shaped manner.

The waveguide components shown can be used as resonators, filters, oscillators, or motion sensors.

EMBODIMENTS OF THE INVENTION

The invention will be explained in greater detail below, using several exemplary embodiments. The related drawings show FIG. 1 a waveguide component having a ring-shaped interdigital converter on a piezoelectric substrate, whereby the interdigital converter is a single-gate resonator, FIG. 2 a waveguide component having two interdigital converters, configured as ring segments, on a piezoelectric substrate, which represent a two-gate resonator, FIG. 3 a waveguide component having six interdigital converters connected to form a hexagon, on a piezoelectric substrate, which form a single-gate resonator, FIG. 4 a waveguide component having a circular piezoelectric layer and an interdigital converter disposed at a defined distance above it, whereby this component represents a single-gate resonator.

EXAMPLE 1

This exemplary embodiment relates to FIG. 1.

Here, the surface of a piezoelectric substrate 1 having hexagonal symmetry, of the crystal class 6 mm, e.g. aluminum nitride, is coated with an aluminum layer having a layer thickness h, which, with reference to the wavelength $\lambda$, amounts to $h/\lambda=0.05$. The ring-shaped structure 2 has been produced by means of structuring of this aluminum layer. The substrate 1 has been cut in such a manner that the hexagonal axis of the substrate crystal is oriented perpendicular to the substrate surface. The ring-shaped structure 2 has the shape of a circle and comprises the circular collector electrodes 3 and 4 as well as the tine region 5 having the tines 6. The collector electrodes 3; 4 are delimited by concentric circles, whose common center point is the point M. The collector electrodes 3; 4 and the tine region 5 having the tines 6 form an interdigital converter. The tines 6 of the tine region 5 point towards the center point M. The collector electrodes 3; 4 are connected with the electrical input that is formed by the connectors 7; 8. The structure 2 with the connectors 7; 8 represents a single-gate resonator. The tine region 5, in interaction with the collector electrodes 3; 4, is a waveguide for acoustic surface waves. This waveguide guides the waves on a circular track, so that no reflectors are required to generate standing waves.

EXAMPLE 2

Figure 2:
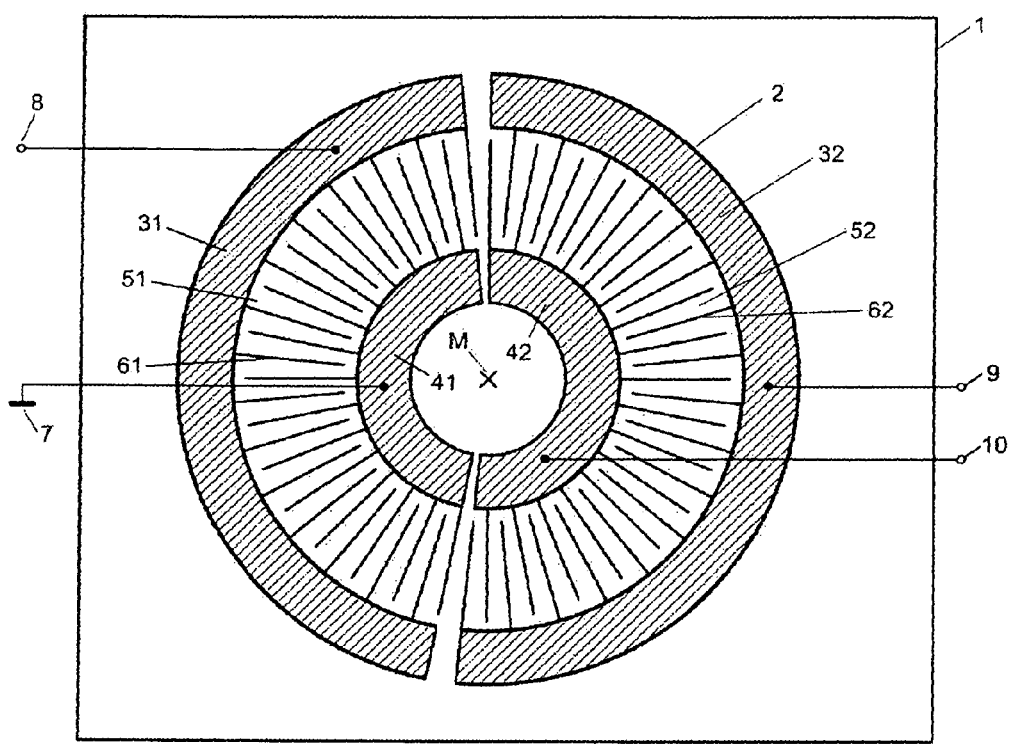

This exemplary embodiment is described using FIG. 2.

Here, the surface of a piezoelectric substrate 1 having hexagonal symmetry, of the crystal class 6 mm, e.g. aluminum nitride, is coated with an aluminum layer having a layer thickness h, which, with reference to the wavelength $\lambda$, amounts to $h/\lambda=0.05$. The ring-shaped structure 2 has been produced by means of structuring of this aluminum layer. The substrate 1 has been cut in such a manner that the hexagonal axis of the substrate crystal is oriented perpendicular to the substrate surface. The ring-shaped structure 2 has the shape of a circle and comprises the collector electrodes 31 and 41, 32 and 42, as well as the tine region 51; 52. The delimitations of the collector electrodes 31; 41; 32; and 42 are arcs that, aside from narrow interruptions, form concentric circles around the center point M. The collector electrodes 31; 41 and the tine region 51 having the tines 61 form an interdigital converter. The collector electrodes 32; 42 and the tine region 52 having the tines 62 form a second interdigital converter. The tines 61; 62 of the tine region 51 or 52 respectively point towards the center point M. The collector electrodes 31; 41 and 32; 42 are connected with the electrical input and output, respectively, that is formed by the connectors 7; 8 and 9; 10, respectively. The structure 2 with the connectors 7; 8 and 9: 10 represents a two-gate resonator. The tine regions 51 and 52, in interaction with the collector electrodes 31; 32 and 41; 42, are a waveguide for acoustic surface waves. This waveguide guides the waves on a circular track, so that no reflectors are required to generate standing waves.

EXAMPLE 3

Figure 3:
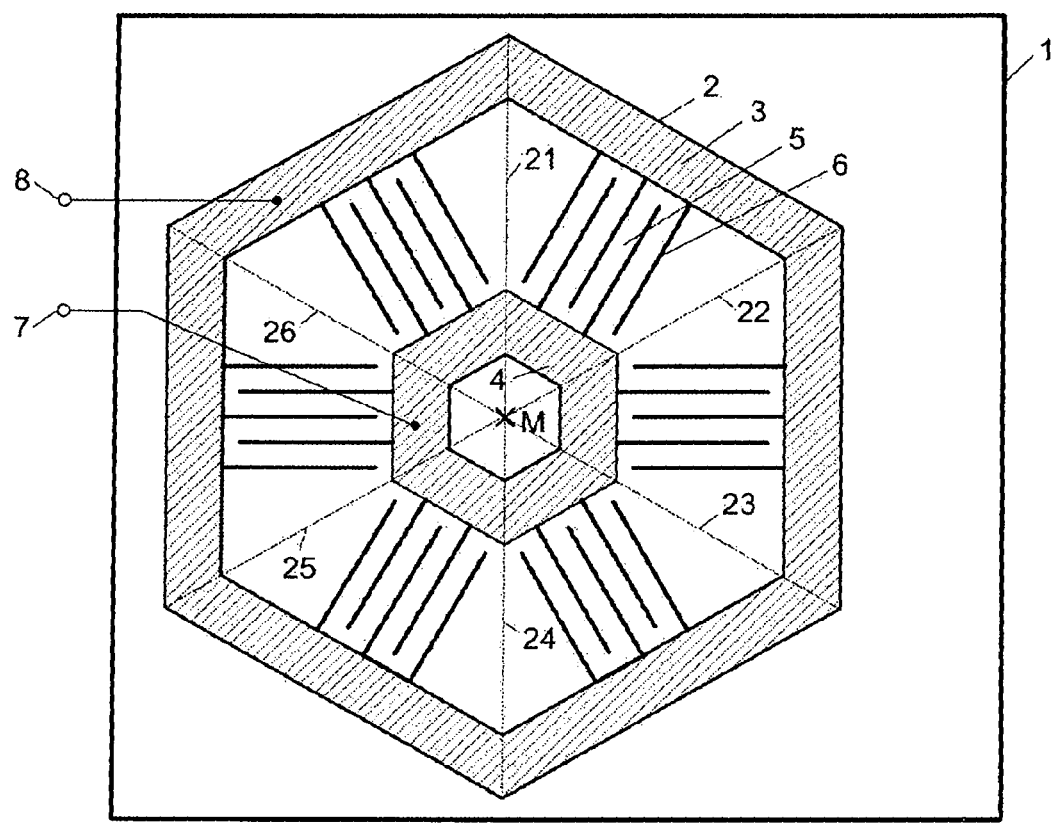

This exemplary embodiment relates to FIG. 3.

Here, the surface of a piezoelectric substrate 1 having hexagonal symmetry, of the crystal class 6 mm, e.g. aluminum nitride, is coated with an aluminum layer having a layer thickness h, which, with reference to the wavelength $\lambda$, amounts to $h/\lambda=0.05$. The ring-shaped structure 2 has been produced by means of structuring of this aluminum layer. The substrate 1 has been cut in such a manner that the hexagonal axis of the substrate crystal is oriented perpendicular to the substrate surface. The ring-shaped structure 2 has the shape of an equilateral hexagon as an example of a polygon, and comprises the hexagonal collector electrodes 3 and 4 as well as the tine region 5 having the tines 6. The collector electrodes 3; 4 are delimited by concentric hexagons, whose common center point is the point M. Corner points of the hexagonal delimitations of the collector electrodes 3; 4 that lie opposite one another, in each instance, are connected with one another by means of the straight lines 21 to 26, which also run through the center point M. The collector electrodes 3; 4 and the tine region 5 having the tines 6 form an interdigital converter. The collector electrodes 3; 4 are connected with the electrical input that is formed by the connectors 7; 8. The structure 2 with the connectors 7; 8 represents a single-gate resonator. The tine region 5, in interaction with the collector electrodes 3; 4, is a waveguide for acoustic surface waves. This waveguide guides the waves on a closed hexagonal track, so that no reflectors are required to generate standing waves.

EXAMPLE 4

Figure 4:
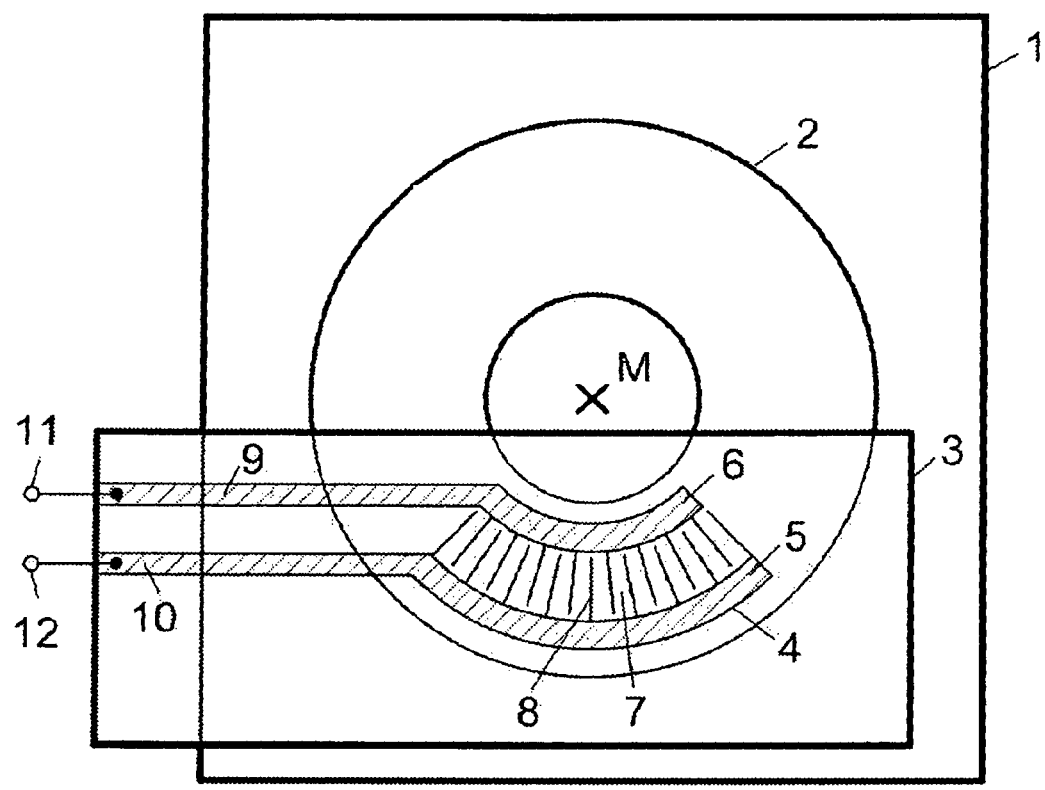

This exemplary embodiment is explained using FIG. 4.

Here, the surface of a non-piezoelectric substrate 1 is coated with a piezoelectric layer having hexagonal symmetry, of the crystal class 6 mm, e.g. aluminum nitride. The piezoelectric layer is structured in such a manner that it forms a circular ring 2. The limits of the circular ring 2 are concentric circles having the center point M. A second non-piezoelectric substrate 3 is disposed above the circular ring 2. The surface of the substrate 3, which faces the substrate 1 and the circular ring 2, carries the interdigital structure 4, which is a structured metal layer and consists of the collector electrodes 5; 6 and the tine region 7 having the tines 8. The collector electrodes 5; 6 are delimited in arc shape. The corresponding full circles have the same center point M as the limits of the circular ring 2. All the structure elements that are disposed on the surface of the substrate 3 that faces the circular ring 2 are shown as thin lines in FIG. 4. The surface of the interdigital structure 4 and the surface of the circular ring 2 form a gap whose width is less than the length of a period of the tine region 7. The interdigital structure 4, together with that part of the circular ring 2 that is positioned under the interdigital structure 4, forms an interdigital converter, because acoustic surface waves are excited in the region of the circular ring 2 only as the result of penetration of the electrical field generated by the interdigital structure 4 into the circular ring 2 that consists of a piezoelectric layer. The circular ring 2 is a waveguide for acoustic surface waves. This waveguide guides the waves on a circular track, so that no reflectors are required to generate standing waves. In order to be able to connect the interdigital structure 4 with the connectors 11; 12 at the input, without hindrance by the narrow gap, the conductor tracks 9; 10 that are connected with the collector electrodes 5; 6 are passed to the outside on the surface of the substrate 3 that faces the circular ring 2. The entire assembly represents a single-gate resonator.

The invention claimed is:

1. Waveguide components on the basis of acoustic surface waves, containing at least one interdigital converter for exciting acoustic surface waves in a piezoelectric substrate or a piezoelectric layer, wherein the interdigital converter or converters
   a) are disposed at a defined distance above the piezoelectric substrate or the piezoelectric layer for exciting wave fields, or
   b) are in contact with the piezoelectric substrate formed as a disk or the piezoelectric layer,
   whereby in the case of Variant a), the piezoelectric substrate is configured as a ring, and the piezoelectric layer is configured as a ring-shaped region, and in the case of Variant b), the interdigital converters and/or the piezoelectric layer form ring-shaped regions, and wherein the metal layer thickness of fingers of the interdigital converters is greater or less than the layer thickness of the metal layer that connects the fingers.

2. Waveguide component according to claim 1, wherein in the case of Variant a), the interdigital converters are disposed above the piezoelectric substrate or the piezoelectric layer at a distance that is smaller than the period length of the interdigital converters.

3. Waveguide component according to claim 1, wherein the piezoelectric ring is delimited with curved and/or straight edges.

4. Waveguide component according to claim 1, wherein in the case of Variant a), the ring-shaped region of the piezoelectric layer, and in the case of Variant b), the ring-shaped region of the interdigital converters and/or of the piezoelectric layer is delimited with curved and/or straight lines.

5. Waveguide component according to claim 1, wherein in the case of Variant a), the interdigital converters can be disposed so as to be displaceable relative to the piezoelectric substrate or the piezoelectric layer.

6. Waveguide component according to claim 1, wherein in the case of Variant a), the interdigital converters are disposed on an isotropic material.

7. Waveguide component according to claim 1, wherein in the case of Variant a), a non-piezoelectric substrate is used, which has one or more ring-shaped piezoelectric regions, which are delimited by curved and/or straight lines.

8. Waveguide component according to claim 1, wherein in the case of Variant b), the interdigital converters, while avoiding reflector assemblies, form ring-shaped regions that are delimited by curved and/or straight lines.

9. Waveguide component according to claim 1, wherein interdigital converter or converters are in contact with the piezoelectric substrate formed as a disk or the piezoelectric layer, and wherein multiple interdigital converters are present, said multiple interdigital converters being disposed one after the other in the wave propagation direction, and, in this connection, form ring-shaped regions that are delimited by curved and/or straight lines.

10. Waveguide component according to claim 1, wherein one or more single-phase or multi-phase unidirectional converters are present as interdigital converters.

11. Waveguide component according to claim 1, wherein an alternating field composed of multiple components, whose phases are shifted, relative to one another, is applied to the interdigital converters.

12. Use of the waveguide component according to claim 1 as a motion sensor.

13. Waveguide component according to claim 1, wherein in the case of Variant b), the interdigital converters are configured in ring shape, in the form of a circle, an ellipsis, or a polygon.

14. Waveguide component according to claim 1, wherein the layer thickness of the interdigital converters and/or the material of the piezoelectric substrate and of the piezoelectric layer are selected in such a manner that the phase velocity of the acoustic surface waves within the ring-shaped region of the piezoelectric layer and within the ring-shaped region of the interdigital converter is less than outside of these regions.

15. Waveguide component according to claim 1, wherein the piezoelectric layer is disposed on an isotropic material.

16. Waveguide component according to claim 1, wherein multiple interdigital converters are present in different ring-shaped regions, the multiple interdigital converters being disposed so closely adjacent that their wave fields are partially superimposed.

17. Waveguide component according to claim 16, wherein at least one other ring-shaped interdigital converter is surrounded by at least one of the interdigital converters configured in ring-shaped manner.

18. Use of the waveguide component according to claim 1 as a resonator, filter, or oscillator.

19. Waveguide components on the basis of acoustic surface waves, containing at least one interdigital converter for exciting acoustic surface waves in a piezoelectric substrate or a piezoelectric layer;
   wherein the interdigital converter or converters are in contact with the piezoelectric substrate formed as a disk or the piezoelectric layer;
   wherein the interdigital converters and/or the piezoelectric layer form ring-shaped regions; and
   wherein with a ring-shaped interdigital converter, the piezoelectric substrate is a slice of a crystal having hexagonal symmetry, and the normal line of the substrate surface and the hexagonal axis are parallel to one another.

* * * * *